US006982553B2

(12) United States Patent  (10) Patent No.: US 6,982,553 B2
Holle (45) Date of Patent: Jan. 3, 2006

(54) RADIO FREQUENCY COIL WITH TWO PARALLEL END CONDUCTORS

(75) Inventor: Eerke Holle, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/493,688

(22) PCT Filed: Oct. 17, 2002

(86) PCT No.: PCT/IB02/04313

§ 371 (c)(1), (2), (4) Date: Apr. 23, 2004

(87) PCT Pub. No.: WO03/036318

PCT Pub. Date: May 1, 2003

(65) Prior Publication Data

US 2004/0245989 A1 Dec. 9, 2004

(30) Foreign Application Priority Data

Oct. 24, 2001 (EP) .................................. 01204045

(51) Int. Cl.
 *G01V 3/00* (2006.01)
(52) U.S. Cl. ....................................... 324/318; 600/421
(58) Field of Classification Search ................ 324/318, 324/322, 312, 314, 319, 300; 600/421, 422, 600/423
 See application file for complete search history.

(56) References Cited

U.S. PATENT DOCUMENTS 4,737,718 A 4/1988 Kemner et al.
4,820,985 A * 4/1989 Eash ........................... 324/318
5,474,069 A * 12/1995 Wong et al. ................. 600/422
5,999,000 A * 12/1999 Srinivasan ................... 324/318
6,781,378 B2 * 8/2004 Eberler et al. ............... 324/318

* cited by examiner

Primary Examiner—Louis Arana
(74) Attorney, Agent, or Firm—Fay, Sharpe, Fagan, Minnich & McKee

(57) ABSTRACT

A radio-frequency coil (RF-coil) (19) for use in a magnetic-resonance imaging apparatus comprises a number of parallel bar-shaped electric conductors (37) arranged at regular intervals on an imaginary cylinder (39) and surrounded by a radio-frequency shield (RF-shield) (49). The bar-shaped conductors surround a measuring volume (11) and are interconnected at least at one of their end portions (41, 45) by an electric end conductor (43, 47) extending in a plane transverse to the bar-shaped conductors. A further electric end conductor (51, 53) is arranged near and parallel to the end conductor (43, 47), and is electrically connected to the RF-shield (49), preferably by a flange-shaped electric conductor (55, 57). The end conductor (43, 47) and the further end conductor (51, 53) together form a transmission line. An unwanted electromagnetic field ($b_1$) generated by current in the end conductor (43, 47) is compensated for by an electromagnetic field ($b_2$) generated by the current in the further end conductor (51, 53). Thus, the electromagnetic field of the end conductor (43, 47) does not lead to unwanted dissipation effects and temperature increases in the body of a patient present in the measuring volume (11).

14 Claims, 4 Drawing Sheets

RADIO FREQUENCY COIL WITH TWO PARALLEL END CONDUCTORS

Figure 1:
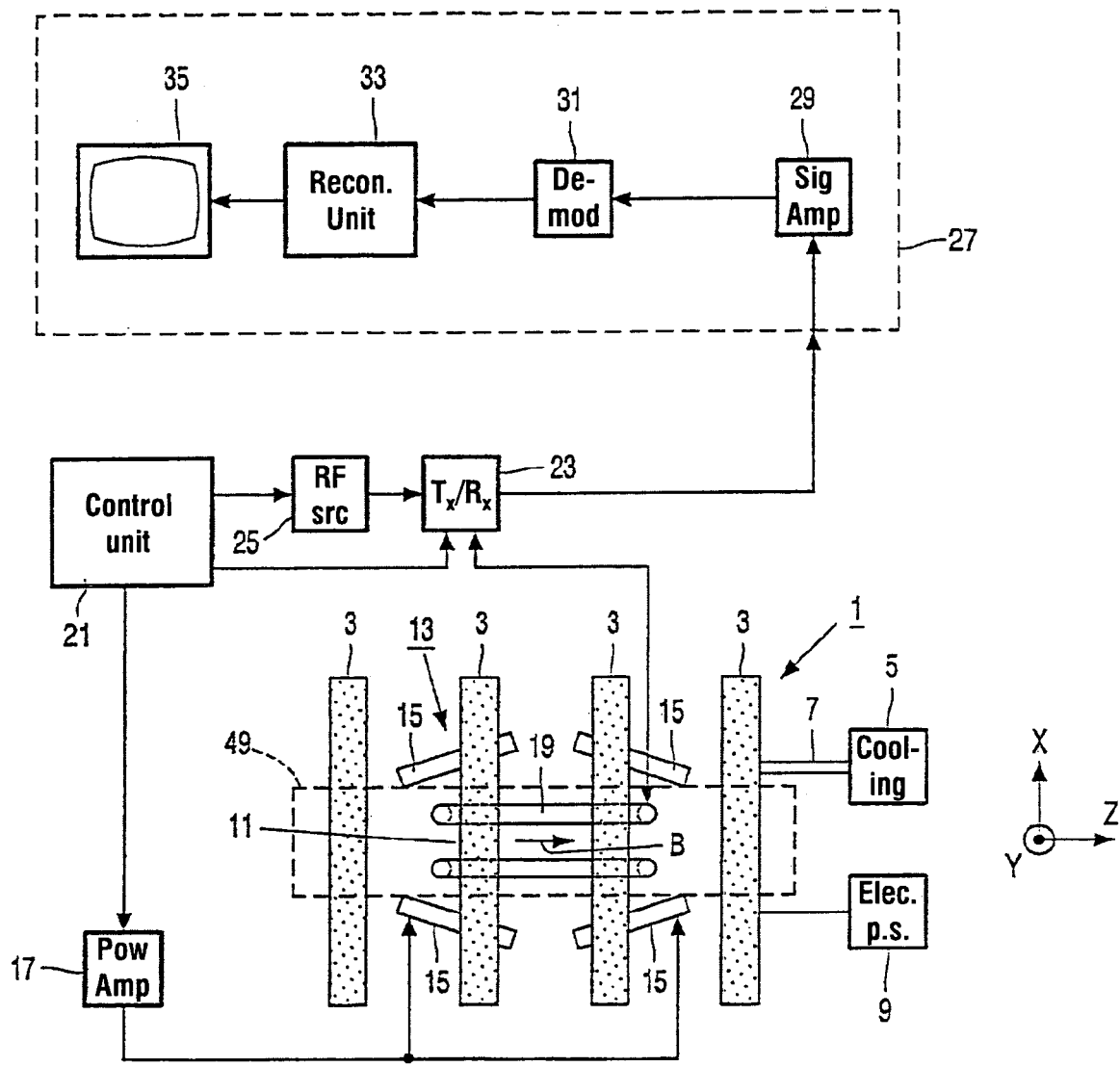

The invention relates to a radio-frequency coil for use in a magnetic-resonance imaging apparatus, which radio-frequency coil is provided with a number of regularly spaced substantially parallel bar-shaped electric conductors that are arranged at least substantially in accordance with an imaginary cylinder, and with a radio-frequency shield arranged around said cylinder, said bar-shaped conductors being interconnected, at least at one of their ends, by means of an electric end conductor extending in a plane transverse to the bar-shaped conductors.

The invention further relates to a magnetic-resonance imaging apparatus provided with a magnetic main system for generating a magnetic main field in a measuring volume, a magnetic auxiliary system for generating at least one gradient of the magnetic main field, a radio-frequency transmitting coil for generating a radio-frequency signal in the measuring volume, a radio-frequency receiving coil for receiving a radio-frequency signal generated by an object present in the measuring volume during operation, and a processor for converting the radio-frequency signal received into an image of the object.

A radio-frequency coil of the type mentioned in the opening paragraphs, and a magnetic-resonance imaging apparatus of the type mentioned in the opening paragraphs, which imaging apparatus is provided with such a radio-frequency coil, are disclosed in U.S. Pat. No. 4,737,718. The known radio-frequency coil is a so-termed birdcage coil. The known imaging apparatus is used to produce images of the internals of living objects by means of the nuclear spin resonance method. By means of the magnetic main system of the imaging apparatus, a magnetic main field having a substantially constant field strength and a substantially constant direction is generated in the measuring volume wherein the object is placed. By means of the magnetic auxiliary system, gradients of the magnetic main field are generated in three orthogonal directions. As the magnetic nuclear spin resonance frequency of the atomic nuclei used to produce the image of the object is proportional to the field strength of the resultant magnetic main field, successive positions in the object are selected by varying said gradients. For each position selected, a radio-frequency signal whose frequency is equal to the nuclear spin resonance frequency in the selected position is generated in the measuring volume by means of the radio-frequency transmitting coil, and a radio-frequency signal is received by means of the radio-frequency receiving coil, which radio-frequency signal is generated in the selected position as a result of the nuclear spin resonance brought about. In the known imaging apparatus, the radio-frequency transmitting coil is also used as a radio-frequency receiving coil. Subsequently, an image of the object is produced by the processor from the radio-frequency signals received for the successively selected positions.

The radio-frequency signal, which is generated in the measuring volume by the known radio-frequency coil, is a magnetic field extending in a direction that is perpendicular to the magnetic main field and that rotates in a plane that extends perpendicularly to the main field, the frequency of said magnetic field being equal to said nuclear spin resonance frequency. For this purpose, the bar-shaped conductors of the radio-frequency coil extend parallel to the magnetic main field, and alternating currents of a frequency equal to said nuclear spin resonance frequency are generated in the bar-shaped conductors, a phase difference of $2\pi/N$ being present between the alternating currents in each pair of juxtaposed bar-shaped conductors, N being the number of bar-shaped conductors. Said alternating current frequency and said phase difference are accurately attained in the known radio-frequency coil in that, in the two end conductors that are ring-shaped in the known radio-frequency coil and that interconnect the ends of the bar-shaped conductors at both sides of the radio-frequency coil, a capacitor of suitable capacitance is arranged between each pair of juxtaposed ends. By means of the radio-frequency shield provided around the circular cylindrically arranged bar-shaped conductors, the environment of the radio-frequency coil, in particular the magnetic main system and the magnetic auxiliary system, are magnetically and electrically shielded from the radio-frequency coil, so that environmental influences having a disturbing effect on the operation of the radio-frequency coil are precluded as much as possible.

A drawback of the known magnetic-resonance imaging apparatus and, in particular, of the known radio-frequency coil used therein is that a magnetic field is generated in the measuring volume by the electric current present in each of the electric end conductors, which magnetic field is at least substantially parallel, at the location of the plane where the relevant end conductor is situated, to the bar-shaped conductors and hence transverse to the magnetic field of the bar-shaped conductors. As a result, the magnetic field of the end conductors is not effective and causes losses and, as a result of dissipation, undesirable temperature increases of the object present in the measuring volume. Said drawback of the known radio-frequency coil does not occur when a so-termed transverse electromagnetic coil is used, which is another known type of radio-frequency coil that does not comprise an end conductor; instead the bar-shaped electric conductors are electrically connected to the radio-frequency shield that, in this type, is cylindrically constructed and arranged around the bar-shaped conductors. Such a transverse electromagnetic coil has the drawback, however, that the absence of an end conductor interconnecting the ends of the bar-shaped conductors causes the electrical coupling between the bar-shaped conductors to be too weak, so that a desirable phase difference between the alternating currents in the bar-shaped conductors as well as a desirable size and frequency of said alternating currents in the bar-shaped conductors can be achieved much less accurately.

It is an object of the invention to provide a radio-frequency coil and a magnetic-resonance imaging apparatus of the types mentioned in the opening paragraphs, which radio-frequency coil generates practically no magnetic field in a direction transverse to the magnetic field of the bar-shaped conductors, and a desirable phase difference between, and a desirable size and frequency of the alternating currents in the bar-shaped conductors being attainable that are at least as accurate as in the radio-frequency coil known from U.S. Pat. No. 4,737,718.

To achieve this object, a radio-frequency coil of the type mentioned in the opening paragraphs is characterized in accordance with the invention in that a further electric end conductor is arranged near and parallel to said end conductor, which further electric end conductor is electroconductively connected, near the end of each bar-shaped conductor, to the radio-frequency shield.

To achieve this object, a magnetic-resonance imaging apparatus of the type mentioned in the opening paragraphs is characterized in accordance with the invention in that the radio-frequency transmitting coil used therein is a radio-frequency coil in accordance with the invention.

It has been found that, in operation, the magnetic field of the radio-frequency coil, i.e. the magnetic field of the bar-shaped conductors and the magnetic field of the end conductor, generates electric currents in the radio-frequency shield that are oppositely directed to the electric currents in the bar-shaped conductors and in the end conductor. Since the radio-frequency coil in accordance with the invention is provided with a further end conductor that is arranged near and parallel to the end conductor, and that is electroconductively connected, near the end of each bar-shaped conductor, to the radio-frequency shield, the magnetic field of the end conductor generates an electric current predominantly in the further end conductor instead of in the radio-frequency shield. As the further end conductor is arranged near and parallel to the end conductor, the end conductor and the further end conductor jointly form an electric transmission line, with said further end conductor forming a return conductor of the end conductor, i.e., the current generated in the further end conductor is substantially equally large as and oppositely directed to the current in the end conductor. By virtue thereof, the further end conductor generates a magnetic field in the measuring volume that is substantially equally strong as and oppositely directed to the magnetic field of the end conductor, as a result of which the radio-frequency coil generates only a very limited, or even hardly any magnetic field in a direction transverse to the magnetic field of the bar-shaped conductors. As in the case of the radio-frequency coil disclosed in U.S. Pat. No. 4,737,718, the ends of the bar-shaped conductors are interconnected by means of the end conductor, as a result of which the desired phase difference between, and the desired size and frequency of the alternating currents in the bar-shaped conductors can be accurately attained, just like in the case of the known radio-frequency coil, by, for example, arranging a capacitor having a suitable capacitance in the end conductor between each pair of juxtaposed bar-shaped conductors.

A particular embodiment of a radio-frequency coil in accordance with the invention is characterized in that the further end conductor is connected to the radio-frequency shield by means of a flange-shaped electric conductor. By using said flange-shaped electric conductor, a particularly efficient electric coupling between the further end conductor and the radio-frequency shield is achieved, so that the electric currents that are generated by the end conductor in the further end conductor and in the radio-frequency shield are almost completely concentrated in the further end conductor and a maximum compensating effect of the magnetic field of the further end conductor is attained.

A further embodiment of a radio-frequency coil in accordance with the invention is characterized in that the bar-shaped conductors are interconnected at both ends by means of an end conductor extending in a plane transverse to the bar-shaped conductors, with a further end conductor being arranged near and parallel to each end conductor, which further end conductor is electroconductively connected, near the relevant end of each bar-shaped conductor, to the radio-frequency shield. In this embodiment, the bar-shaped conductors on both sides of the radio-frequency coil are interconnected by means of a separate end conductor, so that the measuring volume surrounded by the bar-shaped conductors is accessible from both sides of the radio-frequency coil. The undesirable magnetic field of each of the two end conductors is compensated for by the magnetic field of the further end conductor arranged near and parallel to the relevant end conductor.

Yet another embodiment of a radio-frequency coil in accordance with the invention is characterized in that the end conductor and the further end conductor are substantially ring-shaped and arranged in substantially equal axial positions relative to the bar-shaped conductors, with the ring-shaped end conductor having a diameter that is larger than a diameter of the further ring-shaped end conductor. In this embodiment, the further ring-shaped end conductor is predominantly situated between the ring-shaped end conductor and the measuring volume surrounded by the bar-shaped conductors. As a result, the electric field of the ring-shaped end conductor is shielded with respect to the measuring volume by the further ring-shaped end conductor, so that electric field losses of the ring-shaped end conductor, which can be attributed to the fact that the comparatively high electric voltages in the ring-shaped end conductor cause electric currents to be capacitively generated in the object present in the measuring volume, are limited as much as possible.

A particular embodiment of a radio-frequency coil in accordance with the invention is characterized in that the end conductor and the further end conductor are substantially ring-shaped, arranged in successive axial positions with respect to the bar-shaped conductors, and they each have a main surface that extends transversely to the bar-shaped conductors. In this embodiment, the mechanical construction of the end conductor and the further end conductor is comparatively simple, and the further end conductor can be connected to the radio-frequency shield by means of a comparatively simple construction.

A further embodiment of a radio-frequency coil in accordance with the invention is characterized in that the further end conductor substantially surrounds the end conductor. In this embodiment, the end conductor and the further end conductor jointly form, in essence, a substantially coaxial electric transmission line. By virtue thereof, the magnetic field of the end conductor is substantially completely compensated for by the magnetic field of the further end conductor, and the electric field of the end conductor is shielded substantially completely by the further end conductor.

Yet another embodiment of a radio-frequency coil in accordance with the invention is characterized in that the end conductor is electrically connected, near the end of each bar-shaped conductor, to the further end conductor by means of a capacitor. In this embodiment it is achieved that the desired phase difference between, and the desired size and frequency of the alternating currents in the bar-shaped conductors are comparatively barely sensitive to tolerances in the capacitance values of said capacitors. By virtue thereof, the resonance frequency of the radio-frequency coil can be accurately made equal to the nuclear spin resonance frequency by a suitable choice of the capacitance of the capacitors.

Figure 2:
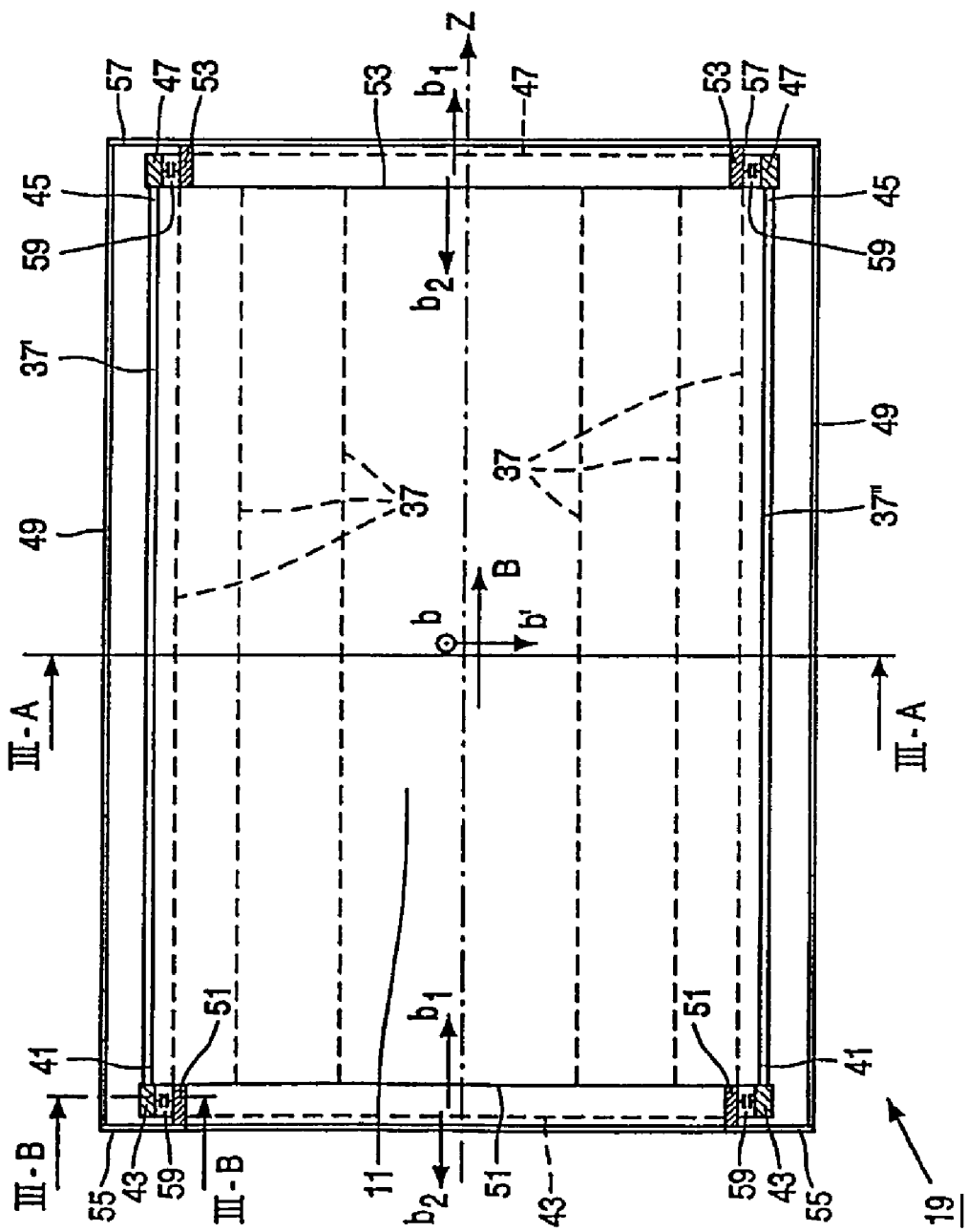
Figure 3A:
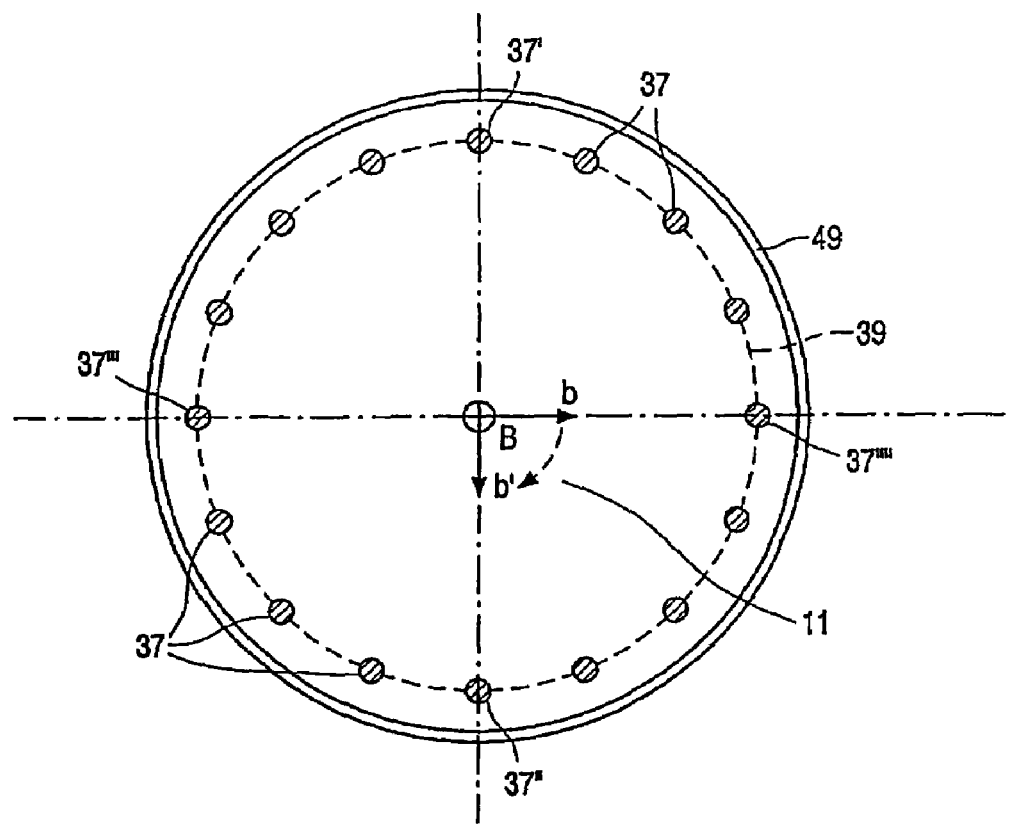
Figure 3B:
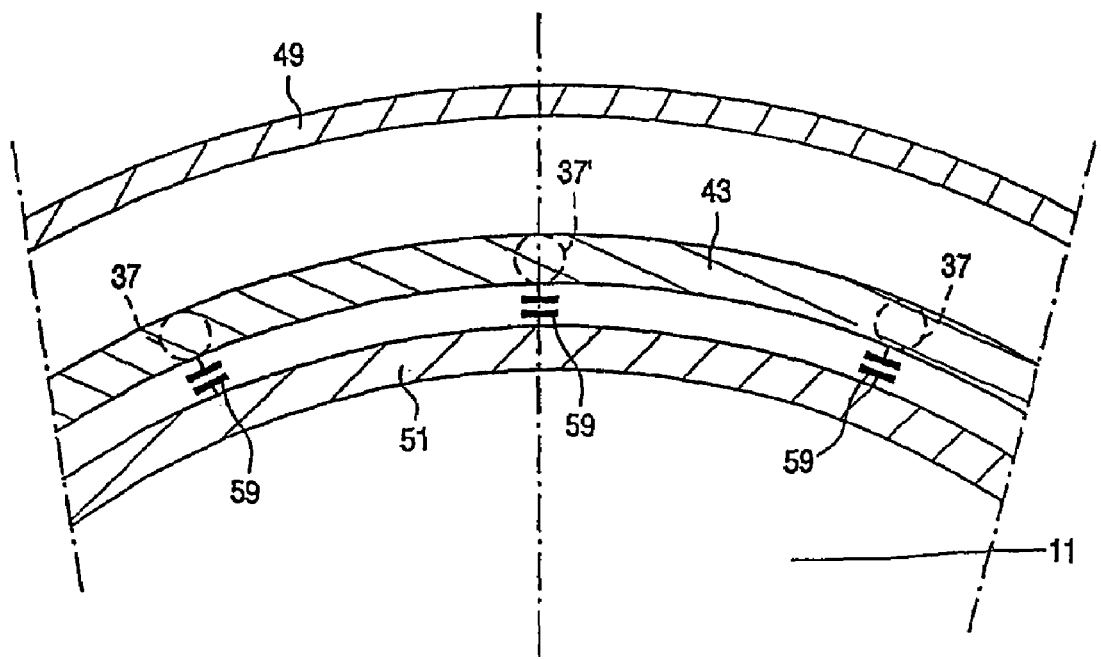
Figure 4:
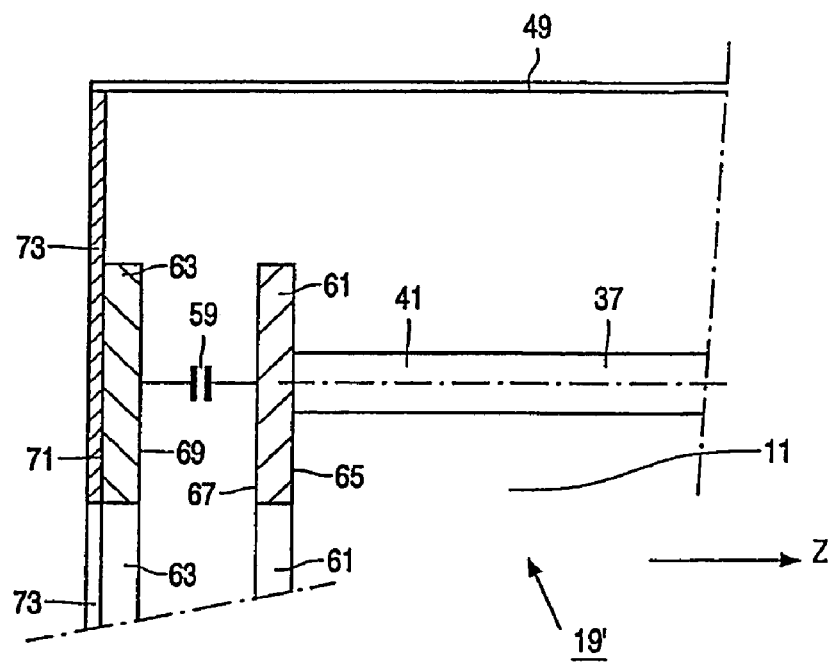
Figure 5:
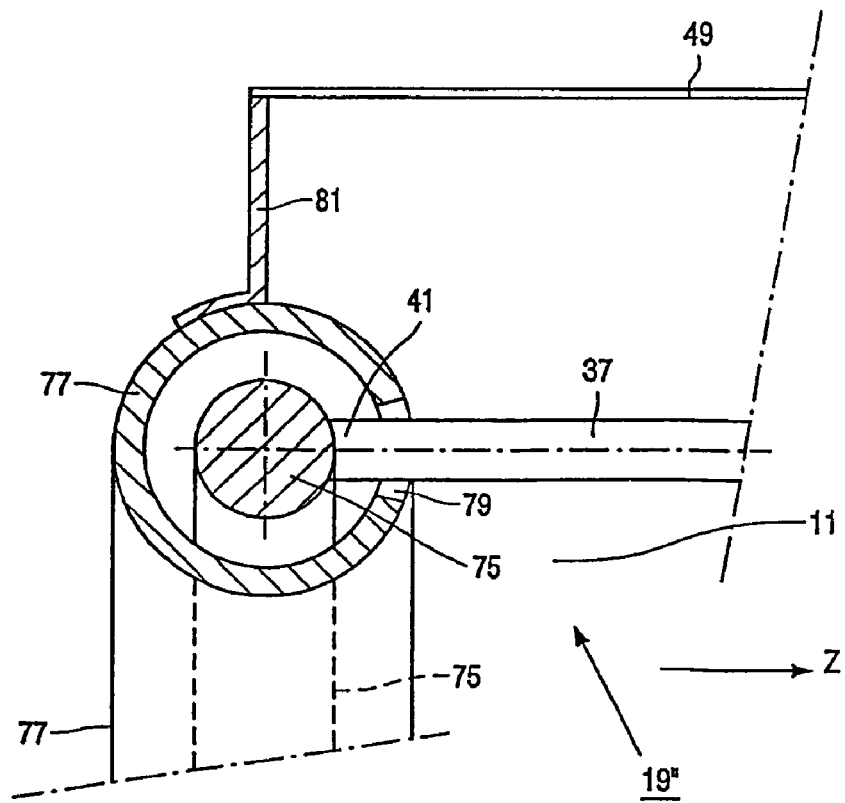

Hereinafter, embodiments of a magnetic-resonance imaging apparatus in accordance with the invention and embodiments of a radio-frequency coil in accordance with the invention employed therein are explained in greater detail with reference to the drawing, wherein FIG. 1 diagrammatically shows a magnetic-resonance imaging apparatus in accordance with the invention, which is provided with a first embodiment of a radio-frequency coil in accordance with the invention, FIG. 2 is a diagrammatic, longitudinal sectional view of the radio-frequency coil used in the magnetic-resonance imaging apparatus n accordance with FIG. 1, FIG. 3*a* is a sectional view taken on the line IIIa—IIIa in FIG. 2, FIG. 3*b* is a sectional view taken on the line IIIb—IIIb in FIG. 2, FIG. 4 is a diagrammatic cross-sectional view of a part of a second embodiment of a radio-frequency coil in accordance with the invention, and FIG. 5 is a diagrammatic cross-sectional view of a part of a third embodiment of a radio-frequency coil in accordance with the invention.

FIG. 1 diagrammatically shows a magnetic-resonance imaging apparatus in accordance with the invention, hereinafter referred to as MRI apparatus, which is used to produce images of the internals of a patient or of a member thereof, such as a head, by means of the nuclear spin resonance method. For this purpose, the MRI apparatus comprises a magnetic main system 1 which, in the example shown, comprises a number of superconductive electromagnets 3. The MRI apparatus comprises a cryogenic cooling arrangement 5 with coolant lines 7 for cooling the electromagnets 3, and an electric power supply 9 for the electromagnets 3. The MRI apparatus further comprises a measuring volume 11 for accommodating a patient to be examined. In operation, the magnetic main system 1 generates a magnetic main field B in the measuring volume 11, which magnetic main field is directed parallel to a main direction Z of the measuring volume 11 and has a substantially constant field strength within the measuring volume 11. The MRI apparatus further comprises a magnetic auxiliary system 13 including a number of electromagnetic gradient coils 15. The gradient coils 15 generate, in operation, gradients of the magnetic main field B in the main direction Z, in an X-direction at right angles to the main direction Z, and in a Y-direction at right angles to the main direction Z and the X-direction. For this purpose, electric currents are necessary in the gradient coils 15, which electric currents are supplied by a power amplifier 17 of the MRI apparatus. The MRI apparatus further comprises a radio-frequency transmitting coil 19 in accordance with the invention, hereinafter referred to as RF coil. Said RF coil 19 generates, in operation, a radio-frequency signal, hereinafter referred to as RF signal, of predetermined frequency in the measuring volume 11. The atomic nuclei, which are hydrogen atoms in the example shown, that are used to produce images by means of the nuclear spin resonance method, have a magnetic nuclear spin resonance frequency that is proportional to the field strength of the magnetic main field resulting from said gradients. In operation, said gradients are varied in accordance with a predetermined program. In this manner, it is achieved that the nuclear spin resonance frequency is equal to the frequency of the RF signal only in a number of successively selected positions in the patient. For each position thus selected, a nuclear spin resonance signal is received by means of the RF coil 19, which signal is generated by the atomic nuclei present in the selected positions as a result of the nuclear spin resonance generated. Subsequently, an image of the internals of the patient is generated from the nuclear spin resonance signals thus received for the successively selected positions. In order to realize the above-described process, the MRI apparatus comprises a control unit 21 wherein said program is stored; this program determines the gradients of the magnetic main field B to be successively generated as well as the RF signals to be successively generated. The control unit 21 controls the power amplifier 17 as well as a radio-frequency transmitting-receiving device 23 to which the RF coil 19 is connected. The control unit 21 further controls a radio-frequency source 25 which, in conjunction with the radio-frequency transmitting-receiving device 23, generates the RF signals to be transmitted by the RF coil 19. The MRI apparatus further comprises a processor 27 for converting the nuclear spin resonance signals received by the RF coil 19 into an image. For this purpose, the processor 27 comprises a signal amplifier 29 for amplifying the nuclear spin resonance signals received by the RF coil 19, a demodulator 31 for demodulating the amplified nuclear spin resonance signals, a reconstruction unit 33 for deriving image signals from the demodulated nuclear spin resonance signals, and a monitor 35 for displaying the image thus generated. In the example shown, the RF coil 19 forms the radio-frequency transmitting coil for transmitting the RF signals as well as a radio-frequency receiving coil for receiving the nuclear spin resonance signals generated in the measuring volume 11. It is to be noted, however, that the invention also includes embodiments of an MRI apparatus comprising a separate radio-frequency transmitting coil for generating the RF signals and a separate radio-frequency receiving coil for receiving the nuclear spin resonance signals generated.

As shown in FIG. 2 and FIG. 3a, the RF coil 19 in accordance with the invention that is used in the MRI apparatus is provided with a number, twelve in the example shown, of bar-shaped electric conductors 37 which are regularly spaced so as to form an imaginary circular cylinder 39 and extend parallel to the main direction Z and the magnetic main field B. The bar-shaped conductors 37 have first ends 41 that are attached to a ring-shaped electric end conductor 43, and second ends 45 that are attached to a ring-shaped electric end conductor 47, with the ring-shaped end conductors 43 and 47 each substantially extending in a plane that is at right angles to the bar-shaped conductors 37. Around the imaginary circular cylinder 39, the RF coil 19 comprises a radio-frequency shield 49, hereinafter referred to as RF shield, which, in the example shown, is circular cylindrical and concentrically arranged with respect to the imaginary circular cylinder 39.

The RF signal, which must be generated by the RF coil 19 to bring about nuclear spin resonance in the measuring volume 11, is an electromagnetic field b which is perpendicularly directed to the magnetic main field B and which rotates in a plane extending perpendicularly to the main field B, and the frequency of which is equal to the nuclear spin resonance frequency. To provide such an alternating, i.e. rotating, electromagnetic field b, alternating currents of a frequency equal to the nuclear spin resonance frequency are generated in the bar-shaped conductors 37, using means that will be outlined hereinafter, with a phase difference of $2\pi/N$ being present between the alternating currents in each pair of juxtaposed bar-shaped conductors 37, N being the number of bar-shaped conductors 37. FIG. 3a shows the electromagnetic field b at a moment in time when the electric currents are maximal in the upper and lower bar-shaped conductors 37' and 37", respectively, and the electromagnetic field b' at a moment in time when the electric currents are maximal in the left and the right bar-shaped conductors 37''' and 37'''', respectively. As the currents in two opposite bar-shaped conductors 37 are always equal in size and oppositely directed, the resultant electromagnetic field b, b' is substantially homogeneous in a substantial part of the measuring volume 11, and substantially perpendicularly directed to the imaginary plane passing through the two bar-shaped conductors 37 wherein the currents are maximal at a certain moment in time. By means of the RF shield 49, which is also diagrammatically shown in FIG. 1, the environment of the RF coil 19, in particular the magnetic main system 1 and the magnetic auxiliary system 13, are magnetically and electrically shielded from the RF coil 19, so that environmental influences having a disturbing effect on the operation of the RF coil 19 are precluded as much as possible.

As the bar-shaped conductors 37 are attached to the ring-shaped end conductors 43 and 47, an alternating current is also present, during operation, in each of the ring-shaped end conductors 43 and 47. The alternating current in the ring-shaped end conductors 43 and 47 generates also an alternating electromagnetic field $b_1$ in the measuring volume 11, which alternating electromagnetic field is diagrammatically shown in FIG. 2, and, at the location of the plane wherein the relevant ring-shaped end conductor 43, 47 extends, said alternating electromagnetic field extends substantially parallel to the bar-shaped conductors 37. Thus, the electromagnetic field $b_1$ extends substantially transversely to the electromagnetic field b of the bar-shaped conductors 37 and, as a result, barely contributes to the generation of nuclear spin resonance in the measuring volume 11. To preclude that the electromagnetic field $b_1$ leads to undesirable temperature increases in the body of the patient due to dissipation effects, a further ring-shaped electric end conductor 51, 53 is arranged in the inventive RF coil 19, near and parallel to each of the two ring-shaped end conductors 43 and 47, with the further ring-shaped end conductors 51 and 53 each being connected to the RF shield 49 by means of a flange-shaped electric conductor 55, 57. In this manner it is achieved that the electric currents which would be generated in the RF shield 49 by the electromagnetic field $b_1$ if the further ring-shaped end conductors 51, 53 were absent, and which are oppositely directed to the electric currents in the ring-shaped end conductors 43, 47, are generated predominantly in the further ring-shaped end conductors 51, 53 instead of in the RF shield 49. As the further ring-shaped end conductors 51, 53 are arranged near and parallel to the ring-shaped end conductors 43, 47, each ring-shaped end conductor 43, 47 and the relevant further ring-shaped end conductor 51, 53 jointly form an electric transmission line, with said further ring-shaped end conductor 51, 53 forming a return conductor of the relevant ring-shaped end conductor 43, 47. As a result, the electric current generated in the further ring-shaped end conductor 51, 53 is substantially equal in size and oppositely directed to the electric current in the relevant ring-shaped end conductor 43, 47. As a result, the further ring-shaped end conductor 51, 53 generates an electromagnetic field $b_2$ in the measuring volume 11, which electromagnetic field, as diagrammatically shown in FIG. 2, is substantially equally strong as and oppositely directed to the field $b_1$ of the relevant ring-shaped end conductor 43, 47. Thus, the field $b_1$ is largely, or even completely compensated by the field $b_2$, so that the RF coil 19 in accordance with the invention generates only a very limited, or even substantially no electric magnetic field in the measuring volume 11 in a direction transverse to the field b of the bar-shaped conductors 37. By virtue thereof, dissipation effects associated with the field $b_1$ and undesirable temperature increases in the body of the patient are limited as much as possible or even precluded almost entirely. A particularly efficient electric coupling between the further ring-shaped end conductors 51, 53 and the RF shield 49 is obtained by virtue of the fact that, in the example shown, the further ring-shaped end conductors 51, 53 are connected to the RF shield 49 by means of the flange-shaped conductors 55, 57, which each form an uninterrupted ring. As a result, the electric currents, which are generated by the field $b_1$ in the further ring-shaped end conductors 51, 53 and in the RF shield 49, are concentrated substantially completely in the further ring-shaped end conductors 51, 53, and a maximum compensating effect of the field $b_2$ is achieved. It is to be noted, however, that a substantial compensating effect of the field $b_2$ is already provided in embodiments wherein the further ring-shaped end conductors 51, 53 are electroconductively connected to the RF shield 49 predominantly only near the ends 41, 45 of the bar-shaped conductors 37. The expression "near the end of each bar-shaped conductor" used in claim 1, however, does not only include embodiments wherein the further ring-shaped end conductor is connected to the RF shield at the location of or near the end of each bar-shaped conductor, but, for example, also embodiments wherein the further ring-shaped end conductor is connected to the RF shield at a location between or centrally between the ends of each pair of juxtaposed bar-shaped conductors.

As is further shown in FIG. 2, the ring-shaped end conductor 43 and the further ring-shaped end conductor 51, as well as the ring-shaped end conductor 47 and the further ring-shaped end conductor 53 are arranged in substantially equal axial positions, i.e., viewed in the main direction Z, with respect to the bar-shaped conductors 37, and the ring-shaped end conductors 43 and 47 each have a diameter that exceeds a diameter of the further ring-shaped end conductors 51, 53. As a result, the further ring-shaped end conductors 51, 53 are each situated between the relevant ring-shaped end conductor 43, 47 and the measuring volume 11, as a result of which the electric field of each ring-shaped end conductor 43, 47 is shielded from the measuring volume 11 by the relevant further ring-shaped end conductor 51, 53. By virtue thereof, electric field losses of the ring-shaped end conductors 43, 47, which are caused by the fact that the comparatively high electric voltages in the ring-shaped end conductors 43, 47 capacitively generate electric currents in the body of the patient, are limited as much as possible.

The necessary alternating currents in the bar-shaped conductors 37 are attained, in the example shown, by connecting two pairs of oppositely arranged bar-shaped conductors 37, in this example the pair of conductors 37' and 37" and the pair of conductors 37''' and 37"", to the radio-frequency source 25 via the radio-frequency transmitting-receiving device 23, with the desired phase difference between, and the desired size and frequency of the alternating currents in the other bar-shaped conductors 37 being attained in that the ends 41, 45 of the bar-shaped conductors 37 are interconnected by means of the ring-shaped end conductors 43, 47, and in that each ring-shaped end conductor 43, 47, as shown in FIG. 2 and FIG. 3b, is electrically connected, near the end 41, 45 of each bar-shaped conductor 37, to the relevant further ring-shaped end conductor 51, 53 by means of a capacitor 59 of suitable capacitance. By virtue of the presence of the ring-shaped end conductor 43, 47, a strong electric coupling between the bar-shaped conductors 37 is obtained, enabling the number of necessary bar-shaped conductors 37 to be limited. The capacitance of the capacitors 59 is such that the RF coil 19 has a resonance frequency that is equal to the nuclear spin resonance frequency. By arranging the capacitors 59 in the positions described hereinabove, it is achieved that the resonance frequency of the RF coil 19 exhibits a very small sensitivity to tolerances in the values of said capacitance. It is to be noted, however, that the invention also includes embodiments wherein the RF coil 19 has been rendered resonant in a different manner. For example, the invention includes embodiments wherein a capacitor is arranged in the ring-shaped end conductors 43, 47, between the ends 41, 45 of each pair of juxtaposed bar-shaped conductors 37, embodiments wherein capacitors are arranged in the bar-shaped conductors 37, and embodiments wherein capacitors are arranged in the ring-shaped end conductors 43, 47 as well as in the bar-shaped conductors 37.

FIG. 4 is a diagrammatic cross-sectional view of a part of a second embodiment of an RF coil 19' in accordance with the invention. Parts of the RF coil 19' that correspond to the above-described RF coil 19 are indicted by means of the same reference numerals in FIG. 4. The main difference between the RF coil 19' and the RF coil 19 resides in that the RF coil 19' is provided on both sides with a ring-shaped end conductor 61 and a further ring-shaped end conductor 63 which is arranged near and parallel to said ring-shaped end conductor, which end conductors are arranged in successive axial positions, i.e., viewed in the main direction Z, with respect to the bar-shaped conductors 37. It is to be noted that, for simplicity's sake, only one side of the RF coil 19' is shown in FIG. 4. In contrast to the ring-shaped end conductors 43, 47 and the further ring-shaped end conductors 51, 53 of the RF coil 19, which have main surfaces extending parallel to the bar-shaped conductors 37, the ring-shaped end conductor 61 and the further ring-shaped end conductor 63 each comprise, in the example shown, two main surfaces 65, 67 and 69, 71, respectively, extending perpendicularly to the bar-shaped conductors 37. The ends 41 of the bar-shaped conductors 37 of the RF coil 19' are attached to the main surface 65 of the ring-shaped end conductor 61 which faces away from the further ring-shaped end conductor 63. The main surface 71 of the further ring-shaped end conductor 63 which faces away from the ring-shaped end conductor 61 is attached to a flange-shaped electric conductor 73 via which the further ring-shaped end conductor 63 is connected to the RF shield 49. The facing main surfaces 67 and 69 of the ring-shaped end conductor 61 and the further ring-shaped end conductor 63 are electrically interconnected, near the end 41 of each bar-shaped conductor 37, via a capacitor 59. In this embodiment, the mechanical construction of the ring-shaped end conductor 61 and the further ring-shaped end conductor 63 is comparatively simple, and said further ring-shaped end conductor 63 is attached to the RF shield 49 by means of a comparatively simple mechanical construction.

FIG. 5 is a diagrammatic cross-sectional view of a part of a second embodiment of an RF coil 19" in accordance with the invention. Parts of the RF coil 19" that correspond to the above-described RF coil 19 are indicated by means of the same reference numerals in FIG. 5. The main difference between the RF coil 19" and the RF coil 19 resides in that said RF coil 19" is provided on both sides with a ring-shaped end conductor 75 and a further ring-shaped end conductor 77 that is arranged near and parallel to said end conductor 75 and substantially surrounds it. It is to be noted that, in FIG. 5, only one side of the RF coil 19" is shown for simplicity's sake. In the example shown, the ring-shaped end conductor 75 is circular in section, whereas the further ring-shaped end conductor 77 is of ring-shaped section that coaxially surrounds the ring-shaped end conductor 75. The ends 41 of the bar-shaped conductors 37 are attached to the ring-shaped end conductor 75, with the further ring-shaped end conductor 77 having an opening 79 near the end 41 of each bar-shaped conductor 37 so as to allow passage of the relevant bar-shaped conductor 37. The further ring-shaped end conductor 77 is attached to a flange-shaped electric conductor 81 via which the further ring-shaped end conductor 77 is connected to the RF shield 49. In the example shown, the RF coil 19" is rendered resonant by means of capacitors, not shown in FIG. 5, in the ring-shaped end conductor 75. Since the further ring-shaped end conductor 77 substantially surrounds the ring-shaped end conductor 75, the ring-shaped end conductor 75 and said further ring-shaped end conductor 77 jointly form a coaxial electric transmission line. As a result, the electromagnetic field of the ring-shaped end conductor 75 is at least substantially, or even completely compensated for by the electric magnetic field of the further ring-shaped end conductor 77. In addition, the electric field of the ring-shaped end conductor 75 is almost entirely, or even completely shielded by the further ring-shaped end conductor 77.

The above-described RF coils 19, 19' and 19" in accordance with the invention are each provided on both sides with an end conductor 43, 47, 61, 75 and a further end conductor 51, 53, 63, 77 which is arranged near end parallel to said end conductor. In this manner it is achieved that, from both sides of the RF coil 19, 19', 19", the measuring volume 11 can be accessed by the patient or a part of the body of the patient. It is to be noted that the invention also includes embodiments of an RF coil that is provided only on one side with an end conductor and a further end conductor arranged near and parallel to said end conductor. In such embodiments, the bar-shaped conductors on the other side of the RF coil are interconnected by means of, for example, a closed end plate or face plate. Such a closed end plate ensures a comparatively good electric coupling between the bar-shaped conductors, however, in such embodiments the measuring volume is accessible from one side of the RF coil only. But such a limited accessibility is sufficient for many applications.

In the case of the above-described RF coils 19, 19' and 19" in accordance with the invention, the bar-shaped electric conductors 37 are arranged in accordance with an imaginary circular cylinder 39 and interconnected by means of ring-shaped electric end conductors 43, 47, 61, 75. It is to be noted that the invention generally comprises embodiments where the bar-shaped conductors are at least approximately arranged in accordance with an imaginary cylinder. This is to be taken to mean that, in each axial position, the RF coil, viewed perpendicularly to the main direction Z, has a corresponding or substantially corresponding transverse profile formed by the collection of cross-sections of the bar-shaped conductors. Unlike the examples shown, the transverse profile does not have to be circular in shape; it may alternatively form a different type of closed curve or polygon. In such embodiments, the shape of the end conductor and the further end conductor corresponds to that of said transverse profile.

Finally, it is noted that the invention also includes embodiments of an RF coil wherein the position of the further end conductor with respect to the end conductor is different from that in the above-described RF coils 19, 19' and 19". An example of such a different position is one in which a ring-shaped end conductor and a further ring-shaped end conductor are arranged in substantially equal axial positions relative to the bar-shaped conductors, and the further ring-shaped end conductor has a larger diameter than the ring-shaped end conductor. In such an embodiment, the electric field of the ring-shaped end conductor is not shielded with respect to the measuring volume by the further ring-shaped end conductor, however, there is comparatively great freedom of design regarding the attachment of the further ring-shaped end conductor to the RF shield.

What is claimed is:

1. A radio-frequency coil for use in a magnetic-resonance imaging apparatus, which radio-frequency coil is provided with a number of regularly spaced substantially parallel bar-shaped electric conductors that are arranged at least substantially in accordance with an imaginary cylinder, and with a radio-frequency shield arranged around said cylinder, said bar-shaped conductors being interconnected, at least at one of their ends, by means of an electric end conductor extending in a plane transverse to the bar-shaped conductors, characterized in that a further electric end conductor is arranged near and parallel to said end conductor, which further electric end conductor is electroconductively connected, near the end of each bar-shaped conductor, to the radio-frequency shield.

2. A radio-frequency coil for use in a magnetic-resonance imaging apparatus, the radio-frequency coil comprising:
- a plurality of spaced apart substantially parallel bar-shaped electric conductors arranged around a measuring volume;
- a radio-frequency shield arranged around the spaced apart substantially parallel bar-shaped electric conductors;
- a first electric end conductor disposed proximate to a first end of the parallel bar-shaped conductors, the first end conductor arranged transverse to the bar-shaped conductors and electrically interconnecting the bar-shaped conductors; and
- a first further electric end conductor arranged proximate to the first end of the parallel bar-shaped conductors, the first further electric end conductor being parallel to the first end conductor, the first further electric end conductor being electroconductively connected to the radio-frequency shield.

3. The radio-frequency coil as claimed in claim 2, further including:
- a flange-shaped electric conductor connecting the first further end conductor to the radio-frequency shield.

4. The radio-frequency coil as claimed in claim 2, further including:
- a second end conductor disposed proximate to a second end of and extending transverse to the bar-shaped conductors; and
- a second further end conductor arranged near and parallel to the second end conductor, which second further end conductor is electroconductively connected to the radio-frequency shield.

5. The radio-frequency coil as claimed in claim 2, wherein the first end conductor and the first further end conductor are substantially ring-shaped and arranged in substantially equal axial positions relative to the bar-shaped conductors.

6. The radio-frequency coil as claimed in claim 2, wherein the first end conductor and the first further end conductor are substantially ring-shaped and arranged in different axial positions along the bar-shaped conductors.

7. The radio-frequency coil as claimed in claim 2, wherein the first further end conductor substantially surrounds the first end conductor.

8. The radio-frequency coil as claimed in claim 2, further including:
- a capacitor electrically connecting the first end conductor to the first further end conductor near the first end of each bar-shaped conductor.

9. A magnetic-resonance imaging apparatus provided with a magnetic main system for generating a magnetic main field in a measuring volume, a magnetic auxiliary system for generating at least one gradient of the magnetic main field, a radio-frequency transmitting coil for generating a radio-frequency signal in the measuring volume, a radio-frequency receiving coil for receiving a radio-frequency signal generated by an object present in the measuring volume during operation, and a processor for converting the radio-frequency signal received into an image of the object, characterized in that the radio-frequency transmitting coil is a radio-frequency coil as claimed in claim 2.

10. The radio-frequency coil as claimed in claim 2, wherein the first end conductor and the first further end conductor are ring shaped, and the first ring-shaped end conductor has a diameter that is larger than a diameter of the first further ring-shaped end conductor.

11. The radio-frequency coil as claimed in claim 2, wherein the spaced apart substantially parallel bar-shaped electric conductors that are arranged at least substantially in accordance with an imaginary cylinder.

12. A radio-frequency coil as claimed in claim 2, wherein the first end conductor and the first further end conductor cooperatively define an electric transmission line in which the first further end conductor forms a return conductor of the first end conductor.

13. A radio-frequency coil as claimed in claim 2, wherein the first further end conductor substantially surrounds the first end conductor to define a coaxial electric transmission line.

14. A radio-frequency coil for use in a magnetic-resonance imaging apparatus, the radio-frequency coil comprising:
- a plurality of spaced apart substantially parallel bar-shaped electric conductors arranged around a measuring volume;
- a radio-frequency shield arranged around the spaced apart substantially parallel bar-shaped electric conductors;
- a transmission line disposed proximate to a first end of the parallel bar-shaped conductors, the transmission line arranged transverse to the bar-shaped conductors and electrically interconnecting the bar-shaped conductors, the transmission line including an electric end conductor and a parallel further electric end conductor forming a return conductor of the end conductor.

* * * * *